(12) United States Patent
Hargovan et al.

(10) Patent No.: US 10,067,500 B2
(45) Date of Patent: Sep. 4, 2018

(54) GENERATING OF 3D-PRINTED CUSTOM WEARABLES

(71) Applicant: Wiivv Wearables Inc., Vancouver (CA)

(72) Inventors: Shamil Mahendra Hargovan, San Jose, CA (US); Enger Lasada Bewza, Surrey (CA); Colin Michael Lawson, Vancouver (CA); Ben Wynne, Escondido, CA (US); Manuj Aggarwal, Vancouver (CA); Louis-Victor Jadavji, West Vancouver (CA); Jamie Lynn Etcheson, San Diego, CA (US); Carlos Montalvo, Menlo Park, CA (US)

(73) Assignee: Wiivv Wearables Inc., Vancouver (CA)

( * ) Notice: Subject to any disclaimer, the term of this patent is extended or adjusted under 35 U.S.C. 154(b) by 0 days.

(21) Appl. No.: 15/634,161

(22) Filed: Jun. 27, 2017

(65) Prior Publication Data
US 2017/0293286 A1 Oct. 12, 2017

Related U.S. Application Data

(63) Continuation of application No. 15/390,406, filed on Dec. 23, 2016.
(Continued)

(51) Int. Cl.
*G06T 19/00* (2011.01)
*G05B 19/4099* (2006.01)
(Continued)

(52) U.S. Cl.
CPC .......... *G05B 19/4099* (2013.01); *A43B 17/00* (2013.01); *A43B 17/003* (2013.01);
(Continued)

(58) Field of Classification Search
None
See application file for complete search history.

(56) References Cited

U.S. PATENT DOCUMENTS

| 7,493,230 B2 | 2/2009 | Schwartz et al. |
| 8,653,151 B2 | 2/2014 | Skaja et al. |
| (Continued) | | |

OTHER PUBLICATIONS

International Search Report and Written Opinion dated Apr. 17, 2017, For Application No. PCT/US16/69603 Filed Dec. 30, 2016., 8 pages.

*Primary Examiner* — Peter Hoang
(74) *Attorney, Agent, or Firm* — Perkins Coie LLP; Colin M. Fowler; Jordan M. Becker

(57) ABSTRACT

Disclosed is a platform for generating and delivering 3-D printed wearables. The platform includes scanning, image processing, machine learning, computer vision, and user input to generate a printed wearable. Scanning occurs in a number of ways across a number of devices. The variability of scanning generates a number of scanning output types. Outputs from the scanning process are normalized into a single type during image processing. The computer vision and machine learning portions of the platform use the normalized body scan to develop models that may be used by a 3D printer to generate a wearable customized to the user. The platform further provides opportunities for the user to check the work of the scanning, image processing, computer vision, and machine learning. The user input enables the platform to improve and inform the machine learning aspects.

26 Claims, 18 Drawing Sheets

Related U.S. Application Data

(60) Provisional application No. 62/275,242, filed on Jan. 6, 2016.

(51) Int. Cl.

| | | |
|---|---|---|
| *B33Y 50/02* | (2015.01) | |
| *A43B 17/00* | (2006.01) | |
| *A43D 1/02* | (2006.01) | |
| *G06T 15/20* | (2011.01) | |
| *G06T 17/20* | (2006.01) | |
| *B33Y 10/00* | (2015.01) | |
| *B33Y 30/00* | (2015.01) | |
| *B33Y 50/00* | (2015.01) | |
| *B29D 35/12* | (2010.01) | |
| *B33Y 80/00* | (2015.01) | |
| *B29C 64/386* | (2017.01) | |
| *B29L 31/50* | (2006.01) | |

(52) U.S. Cl.
CPC ............ *A43D 1/025* (2013.01); *B29C 64/386* (2017.08); *B29D 35/122* (2013.01); *B33Y 10/00* (2014.12); *B33Y 30/00* (2014.12); *B33Y 50/00* (2014.12); *B33Y 50/02* (2014.12); *B33Y 80/00* (2014.12); *G06T 15/205* (2013.01); *G06T 17/20* (2013.01); *B29L 2031/50* (2013.01); *G05B 2219/35134* (2013.01); *G05B 2219/49007* (2013.01); *G06T 2200/04* (2013.01); *G06T 2200/08* (2013.01); *G06T 2215/16* (2013.01)

(56) References Cited

U.S. PATENT DOCUMENTS

| | | |
|---|---|---|
| 9,114,580 B2 | 8/2015 | Skaja et al. |
| 9,402,567 B2 | 8/2016 | Danenberg et al. |
| 9,449,141 B2 | 9/2016 | Schouwenburg et al. |
| 2009/0076425 A1 | 3/2009 | Schwartz |
| 2010/0286951 A1 | 11/2010 | Danenberg et al. |
| 2012/0023776 A1 | 2/2012 | Skaja et al. |
| 2013/0180131 A1 | 7/2013 | Schwartz |
| 2013/0278501 A1* | 10/2013 | Bulzacki ................. G06F 3/017 345/157 |
| 2013/0343610 A1* | 12/2013 | Dal Mutto ......... G06K 9/00355 382/103 |
| 2014/0217636 A1 | 8/2014 | Skaja et al. |
| 2015/0032242 A1 | 1/2015 | Schouwenburg et al. |
| 2015/0210015 A1 | 7/2015 | Schouwenburg et al. |
| 2015/0212343 A1 | 7/2015 | Fonte et al. |
| 2015/0382123 A1 | 12/2015 | Jobani |
| 2016/0085907 A1* | 3/2016 | Schouwenburg ....... G06F 19/12 700/98 |
| 2016/0101571 A1 | 4/2016 | Schouwenburg et al. |
| 2016/0101572 A1 | 4/2016 | Schouwenburg et al. |
| 2016/0180562 A1* | 6/2016 | Naware ............... G06F 3/04842 345/419 |
| 2016/0331071 A1* | 11/2016 | Kane ..................... A43B 17/00 |

\* cited by examiner

GENERATING OF 3D-PRINTED CUSTOM WEARABLES

CLAIM FOR PRIORITY

This application is a continuation of U.S. patent application Ser. No. 15/390,406, entitled, "Generation of 3D-Printed Custom Wearables," filed on Dec. 23, 2016, which claims the benefit to U.S. Provisional Patent Application No. 62/275,242, entitled "Generation of 3D-Printed Custom Wearables," filed on Jan. 6, 2016. The content of the above-identified applications are incorporated by reference in their entirety.

TECHNICAL FIELD

This disclosure relates to 3-D digital modeling and subsequent 3-D printing. This disclosure more particularly relates to input and output handling of image data to generate 3-D models for printing.

BACKGROUND

3-D printing can be used to create customized items. However, the present cost of ownership of a 3-D printer and the requisite skill required for proficient use is prohibitive for most people. Generation of 3-D models for printing that fit a particular wearer, as opposed to standardized sizing schemes, adds a further complexity. There are a number of ways to capture body data; however, going from a number of disparate data types to a usable 3-D model for 3-D printing in an accessible fashion is also a difficult problem.

DETAILED DESCRIPTION

To generate 3D printed wearable objects ("wearables") with simple instructions and minimal processing, the technique introduced here enables commonly available mobile devices to be used to image the prospective wearer and enables a processing server or distributed set of servers to use the resulting images to generate of a tessellation model. These tessellation model can then be used to generate a 3D printed wearable object (hereinafter simply "wearable"). The term "wearable" refers to articles, adornments or items designed to be worn by a user, incorporated into another item worn by a user, act as an orthosis for the user, or interfacing with the contours of a user's body. An example of a wearable used throughout this disclosure to facilitate description is a shoe insole. A shoe insole is illustrative in that the shape and style one particular person would want over the shape and style another person would want tend to vary greatly across people, and customization is an important detail. Nonetheless, the teachings in this disclosure apply similarly to other types of wearables, such as bracelets, rings, bras, helmets, earphones, goggles, support braces (e.g. knee, wrist), gauge earrings, and body-contoured peripherals.

Figure 1:
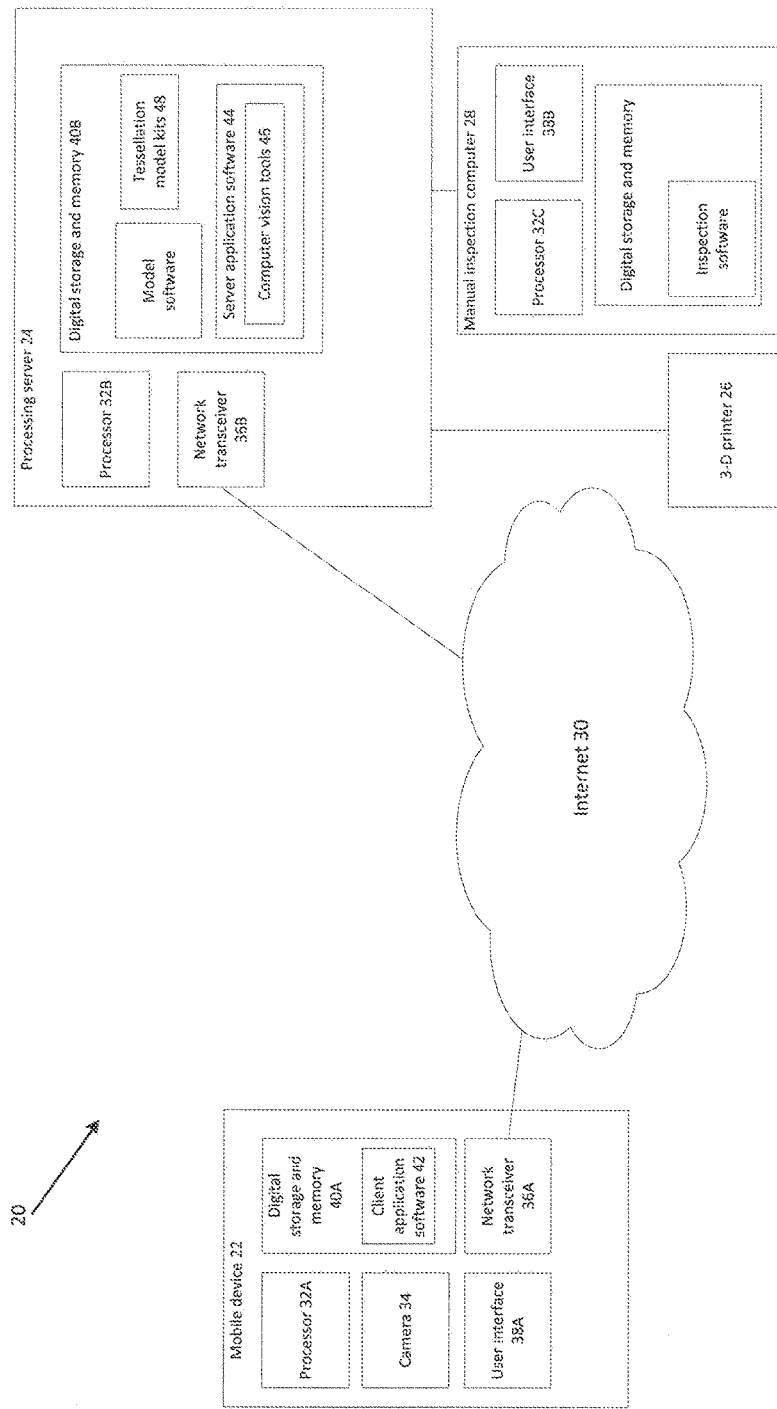
FIG. 1 is a block diagram illustrating a system for the generation of customized 3D printed wearables.

FIG. 1 is a block diagram illustrating a system for the generation of customized 3D printed wearables 20. Included in the system is the capability for providing body part input data. Provided as a first example of such a capability in FIG. 1 is a mobile processing device that includes a digital camera and is equipped to communicate over wireless network, such as a smartphone, tablet computer, a networked digital camera or other suitable known mobile devices in the art (hereafter, "mobile device") 22, a processing server 24, and a 3D printer 26. The system further can include a manual inspection computer 28.

The mobile device 22 is a device that is capable of capturing and transmitting images over a wireless network, such as the Internet 30. In practice, a number of mobile devices 22 can be used. In some embodiments, mobile device 22 is a handheld device. Examples of mobile device 22 include a smart phone (e.g., Apple iPhone, Samsung Galaxy), a confocal microscopy body scanner, an infrared camera, a ultrasound camera, a digital camera, and tablet computer (e.g., Apple iPad or Dell Venture 8 7000). The mobile device 22 is a processor enabled device including a camera 34, a network transceiver 36A, a user interface 38A, and digital storage and memory 40A containing client application software 42.

The camera 34 on the mobile device may be a simple digital camera or a more complex 3D camera, scanning device, or video capture device. Examples of 3D cameras include Intel RealSense cameras or Lytro light field cameras. Further examples of complex cameras may include scanners developed by TOM-CAT Solutions, LLC (the TOM-CAT, or iTOM-CAT), adapted versions of infrared cameras, ultrasound cameras, or adapted versions of intra-oral scanners by 3 Shape.

Simple digital cameras (including no sensors beyond 2-D optical) use reference objects of known size to calculate distances within images. Use of a 3D camera may reduce or eliminate the need for a reference object because 3D cameras are capable of calculating distances within a given image without any predetermined sizes/distances in the images.

The mobile device also provides a user interface 38A that is used in connection with the client application software 42. The client application software 42 provides the user with the ability to select various 3D printed wearable products. The selection of products corresponds with camera instructions for images that the user is to capture. Captured images are delivered over the Internet 30 to the processing server 24.

Processor 32B operates processing server 24. The processing server 24 receives image data from the mobile device 22. Using the image data, server application software 44 performs image processing, machine learning and computer vision operations that populate characteristics of the user. The server application software 44 includes computer vision tools 46 to aid in the performance of computer vision operations. Examples of computer vision tools 46 include OpenCV or SimpleCV, though other suitable examples are known in the art and may be programmed to identify pixel variations in digital images. Pixel variation data is implemented as taught herein to produce desired results.

In some embodiments, a user or administrative user may perform manual checks and/or edits to the results of the computer vision operations. The manual checks are performed on the manual inspection computer 28 or at a terminal that accesses processing server 24's resources. The processing server 24 includes a number of premade tessellation model kits 48 corresponding to products that the user selects from the client application software 42. Edits may affect both functional and cosmetic details of the wearable—edits include looseness/tightness, and high rise/low rise fit. Edits are further stored by the processing server 24 as observations to improve machine learning algorithms.

In some embodiments, the tessellation model kits 48 are used as a starting point from which the processing server 24 applies customizations. Tessellation model kits 48 are a collection of data files that can be used to digitally render an object for 3D printing and to print the object using the 3D printer 26. Common file types of tessellation model kits 48 include .3dm, .3ds, .blend, .bvh, .c4d, .dae, .dds, .dxf, .fbx, .lwo, .lws, .max, .mtl, .obj, .skp, .stl, .tga, or other suitable file types known in the art. The customizations generate a file for use with a 3D printer. The processing server 24 is in communication with the 3D printer 26 in order to print out the user's desired 3D wearable. In some embodiments, tessellation files 48 are generated on the fly from the input provided to the system. The tessellation file 48 is instead generated without premade input through an image processing, computer vision, and machine learning process.

Numerous models of 3D printer 26 may be used by the invented system. 3D printers 26 vary in size of printed article. Based on the type of 3D wearable users are selecting, varying sizes of 3D printer 26 are appropriate. In the case where the 3D wearable is a bracelet, for example, a 6 cubic inch printer may be sufficient. When printing shoe insoles, however, a larger printer may be required. A majority of insoles can be printed with a 1 cubic foot printer, though some larger insoles require a larger 3-D printer.

Users of the system may take a number of roles. Some users may be administrators, some may be the intended wearer of an end, 3-D printed product, some users may facilitate obtaining input data for the system, and some may be agents working on behalf of any of user type previously mentioned.

Figure 2:
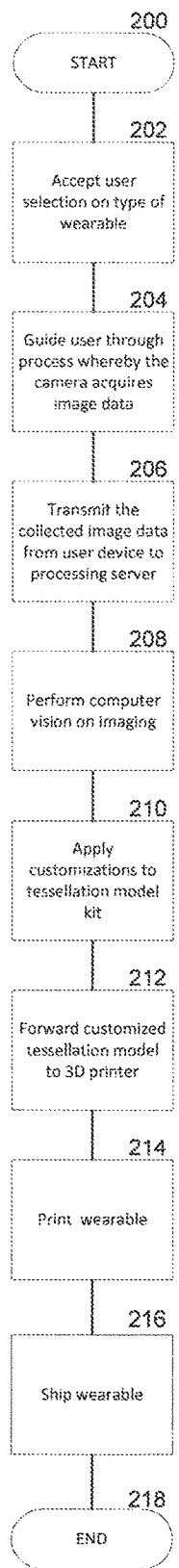
FIG. 2 is a flowchart illustrating a process for generating custom 3D printed wearables.

FIG. 2 is a flowchart illustrating a process for generating custom 3D printed wearables. In step 202, the mobile device accepts input from a user through the user interface concerning the selection of the type of wearable the user wants to purchase. In some embodiments, the mobile device uses a mobile application, or an application program interface ("API") that include an appropriate user interface and enable communication between the mobile device and external web servers. Wearable examples previously mentioned include shoe insoles, bracelets, rings, bras, and gauge earrings. In addition to these examples, the product may be drilled down further into subclasses of wearables. Among shoe insoles, for example, there can be dress shoe, athletic shoe, walking shoe, and other suitable insoles known in the art. Each subclass of wearable can have construction variations.

In addition to choosing the wearable type and subclass, the user enters in account information such as payment and delivering address information. Some embodiments include social features by which the user is enabled to post the results of a 3D wearable customization process to a social network.

In step 204, the mobile device provides instructions to the user to operate the camera to capture images of the user (or more precisely, a body part of the user) in a manner which collects the data necessary to provide a customized wearable for that user. In step 206, the mobile device transmits the collected image data to the processing server 24. In step 208, the processing server performs computer vision operations on the image data in order to determine the size, shape, and curvature of the user (or body part of the user), where applicable to the chosen product type.

In step 210, the server application software obtains size and curvature specifications from the computer vision process to apply these specifications and completes a tessellation model. In some embodiments, the process of applying specifications from computer vision involves the server application software altering a predetermined set of vertices on a premade tessellation model kit that most closely resembles the wearable the user wants to purchase. In addition, details relating to the particular chosen wearable type may be applied to the tessellation model kit as applicable (e.g., textures or shape modifications pertaining to a subclass of wearable).

In an alternative embodiment, the tessellation file is generated on the fly from the input provided to the system. The tessellation file is instead generated without premade input through an image processing, computer vision, and machine learning process.

In step 212, the processing server forwards the customized tessellation model to the 3D printer. In step 214, the 3D printer prints the customized wearable based on the customized tessellation model. In step 216, the wearable is delivered to the user. Delivery to the user depends on a number of factors such as the source of the order and the destination of the order. The system can route the orders to in-house or third party manufacturers that are located closer to the user (geographic location) in order to facilitate the delivery process.

Figure 3:
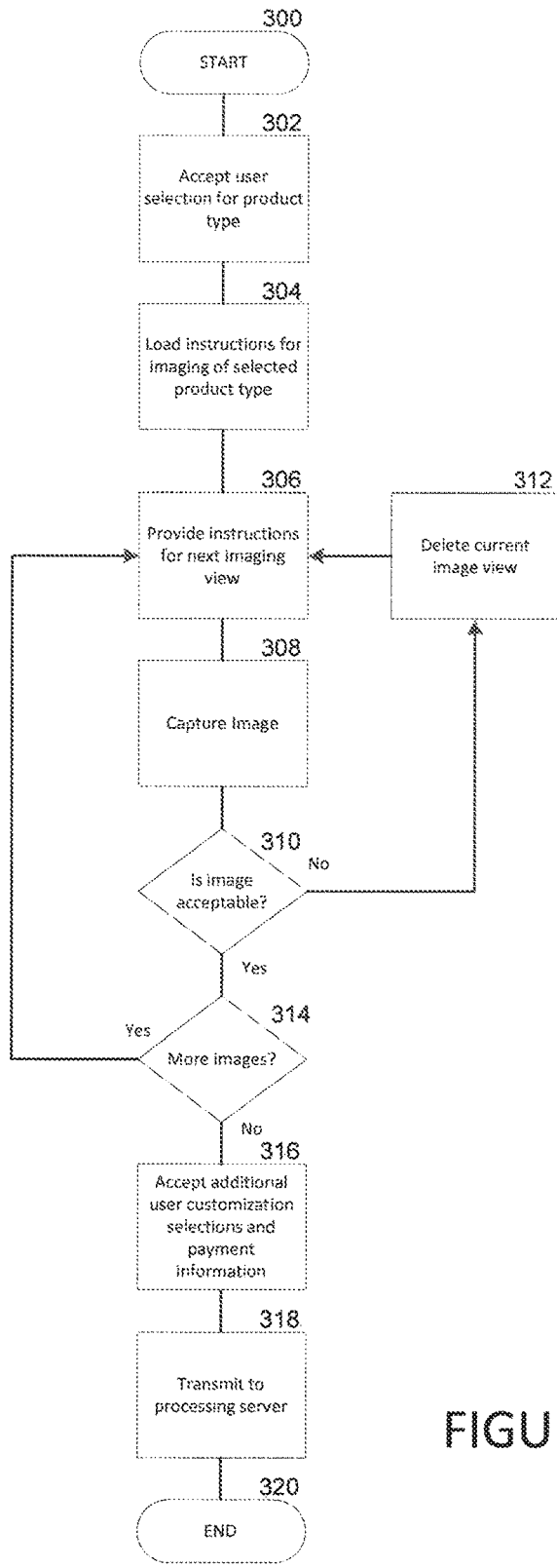
FIG. 3 is a flowchart illustrating a process for acquiring images of the user and other data to be used in creating a customized 3D printed wearable.

FIG. 3 is a flowchart illustrating a process for acquiring images of the user and other data to be used in creating a customized 3D printed wearable. In step 302, upon initiation of the client application software in the mobile device, and in a manner similar to step 202 of FIG. 2, the mobile device prompts for and receives a user selection for wearable type and subclass. In step 304, the client application software loads (e.g., from local or remote memory) the necessary instructions to provide for the wearable type and subclass used to properly direct a user to capture image data of the user's body part or parts as applicable to the wearable type.

In step 306, the loaded instructions are provided to the user via the mobile device's user interface (e.g., via a touchscreen and/or audio speaker) to facilitate image data capture. The body part imaging may involve acquiring multiple images. The images required may depend on the kind of mobile device used and/or the wearable type selected. The instructions provided to the user can include details such as the orientation of the camera and the objects/body parts that should be in frame of the camera's view finder.

In step 308, the mobile device camera captures body part image data. The body part image data may come in any of various formats, such as 2D images, 3D images, video clips, and body scanner imaging data. In some embodiments, the body part image data may come from a 3rd party apparatus (such as a body scanner from a doctor's office), a user uploading images via a website.

In step 310, the client application software performs validation on the captured image. In some embodiments, the validation is performed by the server application software. The validation can use object and pixel recognition software incorporated into either the client or server application software to determine whether or not a given image is acceptable. For example, if the image expected is of the user's foot in a particular orientation, an image of a dog is recognized as unacceptable based on expected variations in pixel color. In the case of an unacceptable image, in step 312, the current image data is deleted or archived, and the user is instructed again to capture the correct image data. When image data is acceptable, the process moves on to step 314.

In step 314, the application software determines if more images are required. If so, the instructions for the next image are presented and the user is once again expected to orient the mobile device correctly to capture an acceptable image. Where the application has all the image data required, the process continues to step 316.

In step 316, the client application software accepts other user customizations that are unconnected to the size, curvature, or shape of the wearable. Examples of these other user customizations include color, material, and branding. In step 318, the wearable data collected is transmitted by the mobile device to the processing server.

Figure 4:
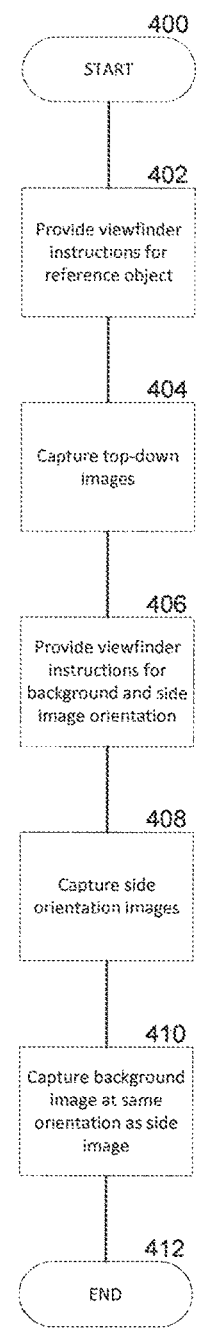
FIG. 4 is a flowchart illustrating a process by which the mobile device interacts with the user to acquire images of the user.

FIG. 4 is a flowchart illustrating a process by which the mobile device interacts with the user to acquire images of the user. In some embodiments, particular image data is used, and multiple images may be requested. In the shoe insole example, where the user wishes to purchase insoles for both feet, five photos of image data for each pair of insoles to be fabricated may be requested (e.g., two images of the top of each of the user's feet, two of the inner side of each of the user's foot, and a background image of the space behind the side images, without the user's foot). Where the user wishes to obtain only a single insole, three images are used. The system does not take the images from the foot that will not serve to model a custom insole.

In step 402, the mobile device provides the user with instructions for the top down views. In some embodiments, where a non-3D camera is used, the instructions include a reference object. In some embodiments, the reference object is a piece of standard-sized paper, such as letter-size (e.g., 8.5×11 inch) or A4 size. Because such paper has well-known dimensions and is commonly available in almost every home, it can be used as a convenient reference object. Based on length versus width proportions of the paper, the application software can determine automatically whether the paper is letter sized, legal size, A4 sized, or other suitable standardized sizes known in the art. Based on the style of the paper, the application software has dimensions of known size within frame of the image. In other embodiments, the user may be asked to indicate the paper size chosen via the user interface (e.g., letter-size or A4).

The instructions for the top down image direct the user to find an open floor space on a hard flat surface (such as wood or tile) in order to avoid warping the paper, thereby casing errors in the predetermined sizes. The user is instructed to place the paper flush against a wall, stand on the paper and aim the mobile device downward towards the top of the user's foot.

In some embodiments, there is additional instruction to put a fold in the paper such that when placed flush with the wall, the paper does not slide under molding or other wall adornments. Additionally, the mobile device user interface includes a level or orientation instruction which is provided by an accelerometer or gyroscope onboard the mobile device. The level shows the user the acceptable angle at which image data is captured.

In some embodiments, no reference object is necessary. Where the mobile device includes two cameras, parallax distance measurement between two photographs may be used to determine a known distance and therefore calculate sizes of the body part. In some cases it is preferable to perform a number of parallax distance measurements to different points between the two photographs in order to find comparative distances between those points enabling derivation of additional angular data between the two photographs. Similarly with the reference object, once the image has a first known distance, other sizes within the image (such as the shape of body parts) may be calculated with mathematical techniques known in the art.

Where a single camera is used, additional sensors are utilized to provide data as necessary. The camera used in conjunction with an accelerometer, gyroscope, or inertial measurement unit ("IMU"), enables a similar effect as where there are two cameras. After the first image is taken, the camera is moved, and the relative movement from the first position is tracked by the IMU. The camera then takes a second image. Given information from the IMU the parallax angle between where the first image was captured and the second image can be calculated.

The method may be performed with a video clip instead. While the video clip is captured, the IMU tracks the movement of the mobile device relative to a first location. Time stamps between the video clip and the IMU tracking are matched up to identify single frames as static images, the parallax angle between each is solvable and the distance to objects in the images are identifiable. In some embodiments, the video clip is an uninterrupted clip. The uninterrupted clip may pass around the body part capturing image data.

In step 404, the mobile device captures images of the user's foot from the top down. Reference is made to the use of a single foot; despite this, this process is repeated for each foot that the user wishes to purchase an insole for. Later, during image processing, computer vision, and machine learning operations on the processing server, the top down images are used to determine the length and width of the foot (at more than one location). Example locations for determining length and width include heel to big toe, heel to little toe, joint of big toe horizontally across, and distance from either side of the first to fifth metatarsal bones. An additional detail collected from the top down view is the skin tone of the user's foot.

In step 406, the mobile application or API provides the user with directions to collect image data for the inner sides of the user's foot. This image is used to later process the curvature of the foot arch. The mobile application or API instructs the user to place the mobile device up against a wall and then place a foot into a shaded region of the viewfinder. Based upon predetermined specifications of the model of mobile device being used, and the orientation of the mobile device (indicated by onboard sensors) the application knows the height of the camera from the floor. Using a known model of mobile device provides a known or expected height for the camera lens.

In step 408, the mobile device captures images of the inner side of the user's foot. Later, during computer vision operations on the processing server, the inner side images are mapped for the curvature of the user's foot arch. Using pixel color differences from the background and the foot, the computer vision process identifies a number of points (ex: 100) from the beginning of the arch to the end. In some embodiments, the server application software uses the skin tone captured from the top down images to aid the computer vision process to identify the foot from the background.

In some embodiments, additional images of the base of the user's foot are also taken. The server application software uses these photos to determine the depth of the user's foot arch. Without the base image data, the depth of the user's foot arch is estimated based on the height of the foot arch as derived from the inner foot side photos.

In step 410, the mobile device provides instructions to take an image matching the inner side foot photos, only without a foot. This image aids the computer vision process in differentiating between the background of the image and the foot from prior images. With some a predetermined degree of error tolerance, the difference between the inner side images and the background images should only be the lack of a foot, thus anything in both images would not be the user's foot.

The example in FIG. 4 concerning a user's foot is intended to be illustrative. Many different body parts can be imaged with similar sets of photographs/media, which may vary in angle and/or number based on the body part.

Figure 5:
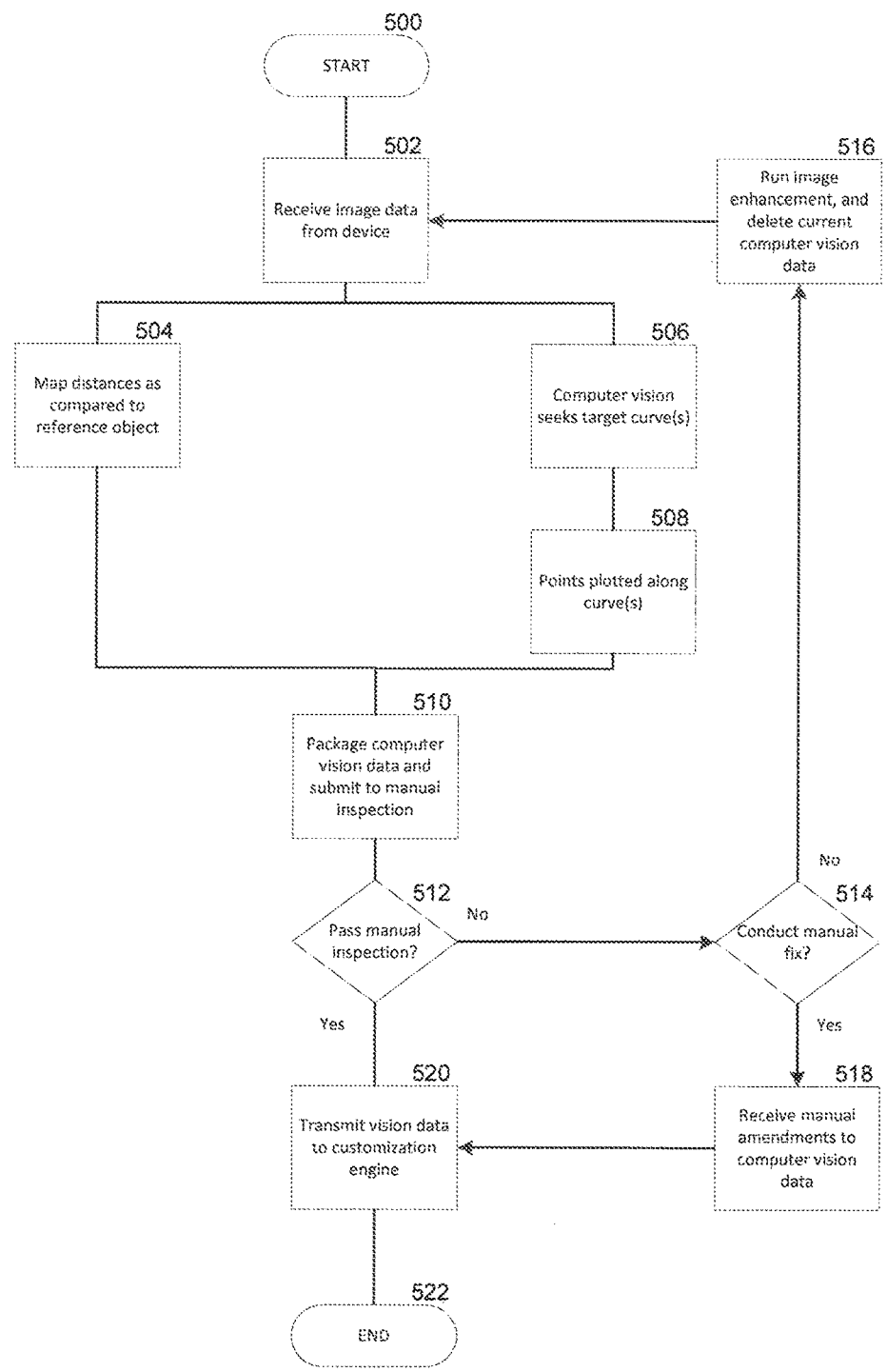
FIG. 5 is a flowchart illustrating a process for performing computer vision on collected images of a user.

FIG. 5 is a flowchart illustrating a process for performing computer vision on collected user images in order to generate size and curvature specifications. FIG. 5 is directed to the example of a foot, though other body parts work similarly. The curves of each body part vary, the use of a foot in this example is represents a complex, curved body structure. The steps of FIG. 5 are performed by the server application software. In step 502, the processing server receives image data from the mobile device. Once received, in step 504 and 506, the processing server performs computer vision operations on the acquired image data to determine size and curvature specifications for the user's applicable body part.

In step 504, the server application software analyzes the image data to determine distances between known points or objects on the subject's body part. Example distances include heel to big toe, heel to little toe, joint of big toe horizontally across, and distance from either side of the first to fifth metatarsal bones. This process entails using predetermined or calculable distances based on a reference object or calculated distances with knowledge of camera movement to provide a known distance (and angle). In some embodiments, the reference object can be a piece of standard size paper (such as 8.5"×11"), as mentioned above. The application software then uses known distances to calculate unknown distances associated with the user's body part based on the image.

Figure 6:
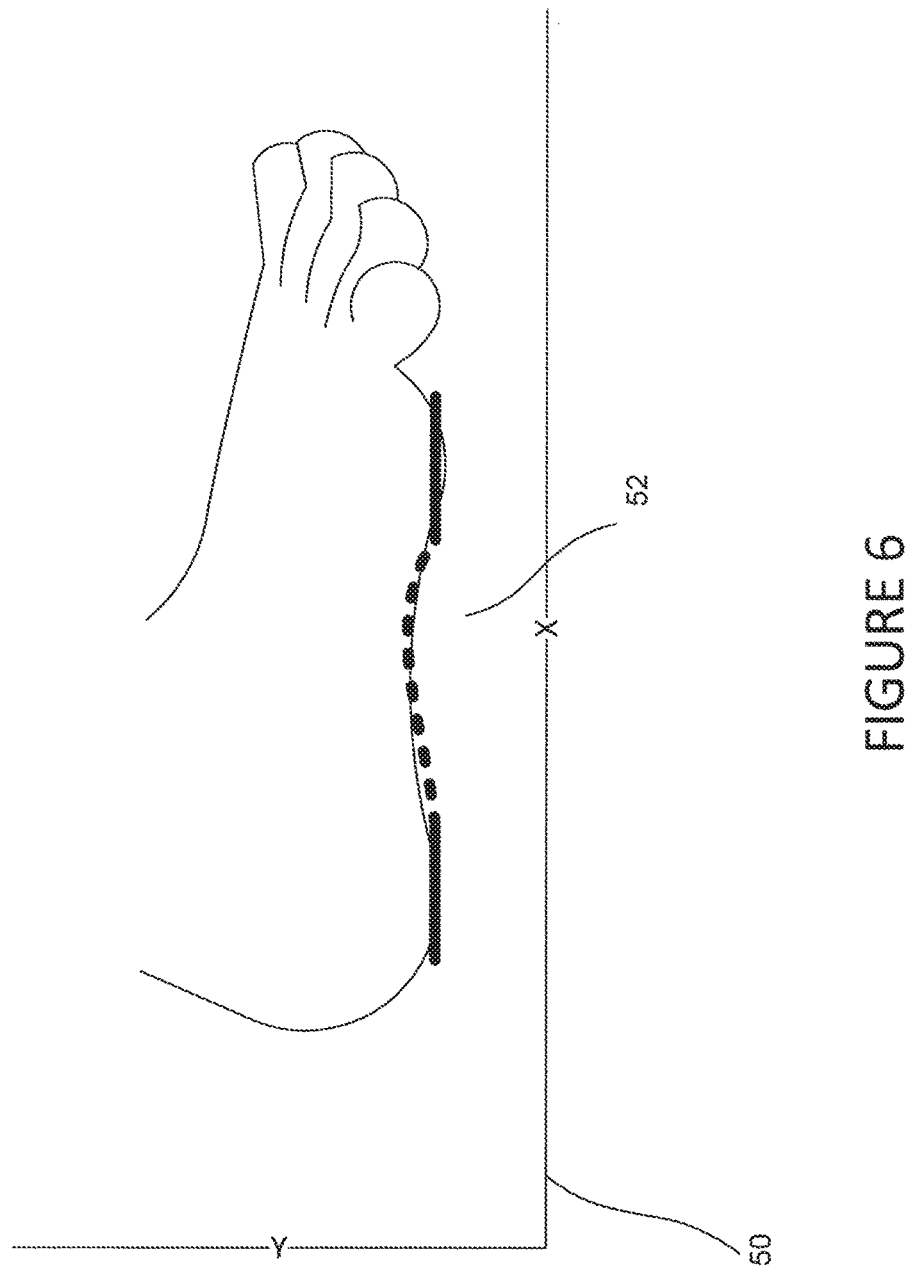
FIG. 6 is an illustration of a coordinate graph including a collection of X,Y locations along a body curve.

In step 506, the processing server analyzes the image data for body part curvature. The computer vision process seeks an expected curve associated with the body part and with the type of wearable selected. Once the curve is found, in step 508, points are plotted along the curve in a coordinate graph (see FIG. 6). Shown in FIG. 6, the coordinate graph 50 includes an X,Y location along the curve in a collection of points 52. Taken together, the collection of points 52 model the curvature of the body part (here, the arch of a foot).

Returning to FIG. 5, in step 510, the processing server packages the data collected by the computer vision process into one or more files for inspection. In some embodiments, in step 512, an administrative user conducts an inspection of the output data from the computer vision process in relation to the acquired images. If there are obvious errors in the data (e.g., the curvature graph is of a shape clearly inconsistent with the curvature of the applicable body part), the generated data is deemed to have failed inspection and can be rejected.

In step 514, a user or an administrator may perform a manual edit of the output data from computer vision reviewed image data. The system transmits a copy of the original images to the user/administrator for editing. The user edits the points and then transmits the edited images. The user only provides a reduced selection of points rather than an entire curvature. If no manual edit occurs, in step 516, the image data is processed through an enhancement process to further improve the distinction between foot and background. The enhancement process refers to image retouching to improve line clarity through editing sharpness, resolution, or selective color by changing using individual pixel, group pixel, or vector image edits. The current computer vision reviewed images are discarded, and the computer vision process is run again. If a manual edit occurs, in step 518, the processing server receives updated curvature and/or size specifications.

In step 520, final copies of the size and curvature specifications of the user's subject body part are forwarded to a customization engine of the server application software on the processing server.

Figure 7:
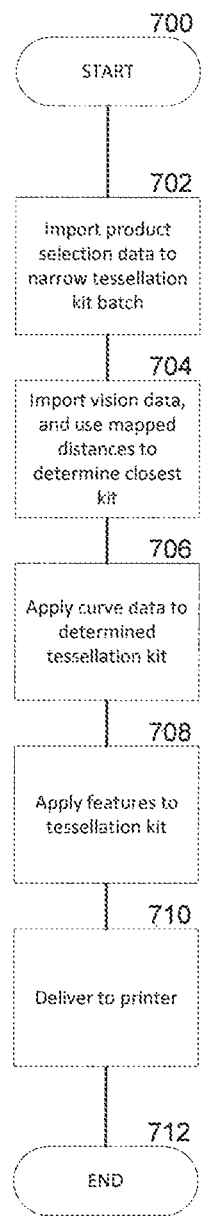
FIG. 7 is a flowchart illustrating a process for customizing tessellation models.

FIG. 7 is a flowchart illustrating a process performed by the customization engine for customizing tessellation models. In step 702, the user's selected wearable type and subclass are used to narrow the selection of tessellation model kits from a large number of provided options to a select group. For example, if the wearable type is a shoe insole, all other wearable type tessellation model kits are eliminated from the given printing task process. Then further if the shoe insole is of subclass "running shoe insole," other shoe insole tessellation model kits are eliminated. For example, the remaining set of premade tessellation model kits may be those associated with different sizes of shoe, men's shoes or women's shoes, or of a limited variation of genetic foot types (ex: normal, narrow, flat, high arch, etc.). The narrowing of tessellation model kits reduces the amount of processing that needs to occur when customization is applied.

In step 704, the computer vision data, including the size and curvature specifications, is imported into the customization engine. In some embodiments, the vision data is roughly categorized, thereby eliminating irrelevant tessellation model kits. Remaining is a single, determined model kit, which most closely resembles the size and curvature specifications. In some embodiments, the tessellation model is built from the ground up on the fly based on the observations in image processing, computer vision and machine learning.

In step 706, the size and curvature specifications are applied to the determined model kit. In doing so, predetermined vertices of the determined model kit are altered using graph coordinates obtained from the computer vision operations.

In step 708, other adjustments can be made to prepare the tessellation model for printing. The other adjustments can be either ornamental and/or functional but are generally unconnected to the measurements of the user obtained through computer vision operations. One possible technique for adjusting a tessellation model uses so-called "negative normals."

Figure 8:
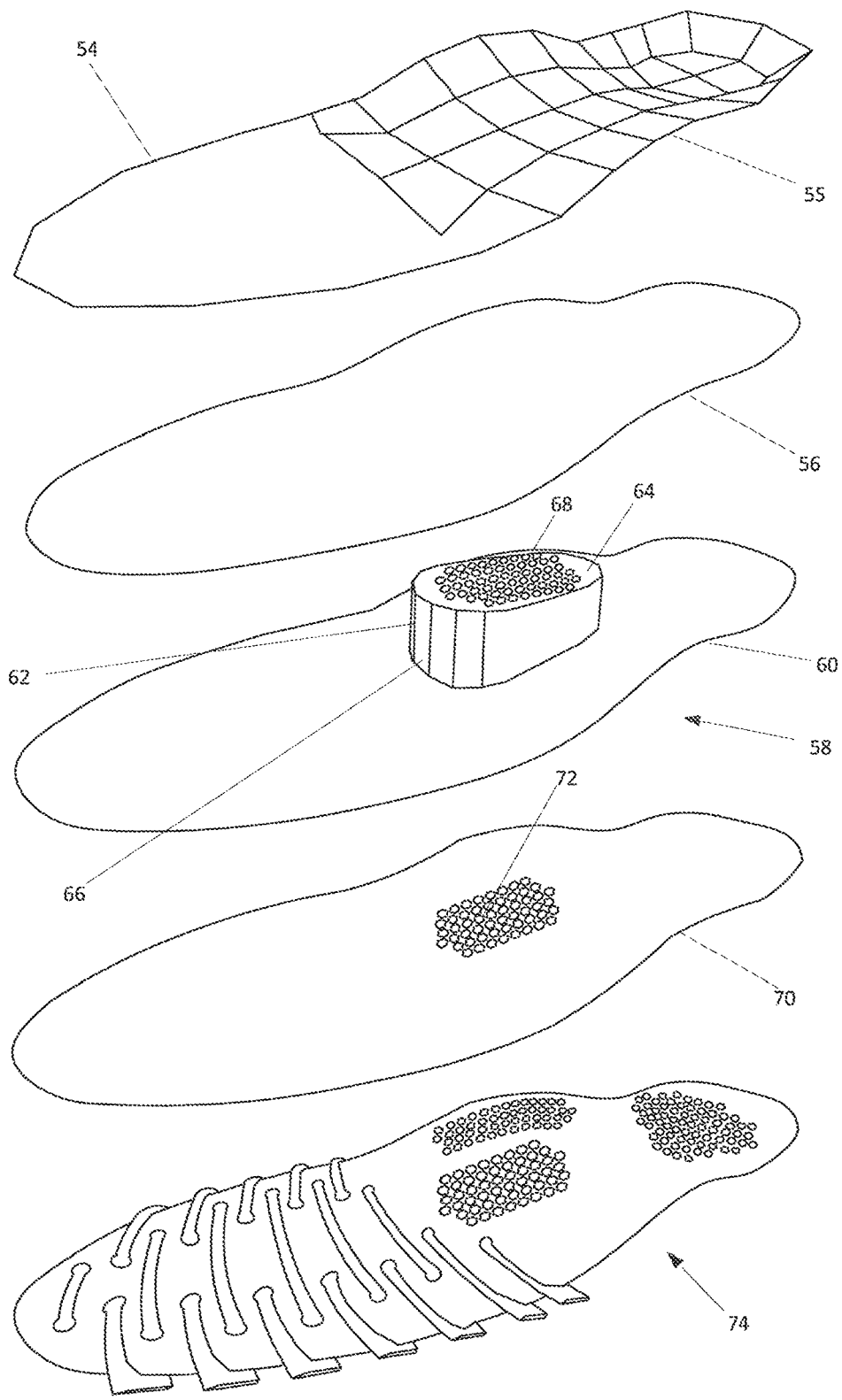
FIG. 8 is an illustration of a negative normal technique to create complex tessellation files.

FIG. 8 illustrates a technique to create or adjust a complex tessellation file that can be used in generating 3D printed wearables as described herein. The technique illustrated in FIG. 8 is referred to as a "negative normal" technique. A 3-D object, model, or lattice is a hollow digital object. The object is constructed from a lattice of planar polygons, e.g., triangles or quadrilaterals. Each polygon 802 that makes up the lattice of the 3-D object has an outer surface and an inner surface.

The term "normal" in this context refers to a normal vector, i.e., a vector that is perpendicular to the surface of a polygon. In a positive object, positive normals point outward from the surface polygons and negative normals point inward from the surface polygons; a negative object is the reverse.

Where a 3D object is generated with the inner side and outer surface reversed such that the inner, negative surface is on the exterior of the 3D object, a negative object is created. Where a negative object intersects with and extends from a positive object, a negative normal is created.

A negative normal is treated as an error by conventional 3D printer software, which results in the printer not printing the portions of the positive object that have negative normals. However, negative normals can be used advantageously to create a 3D printable object with complex geometry.

FIG. 8 illustrates progressions of a positive object (shoe insole) with a negative object applied as a negative normal. The top-most 3-D object 54 is a simple shoe insole positive object, in which the polygons 55 that make up the positive shoe insole are visible. The second object from the top 56 is a smoothed version of the positive insole object. The third object from the top 58 illustrates the use of a negative normal.

In the third object from the top 58, the positive shoe insole 60 intersects with a negative ellipsoid prism 62. The negative ellipsoid 62 includes a horizontal upper surface 64 and an angled lower surface 66 which contacts the upper surface of the positive shoe insole 60. The negative ellipsoid prism 62 further includes a number of vertically oriented negative cylindrical tubes 68. In the empty space where the tubes 68 are not present, the positive shoe insole is unaffected. Where the negative ellipsoid prism intersects the positive shoe insole, the top surface of the positive shoe insole 60 is reduced in height.

In the fourth object from the top 70, the result of the negative normal technique is shown. The positive shoe insole 60 has a number of bumps 72 on the topmost surface caused from the removal of the surrounding polygon lattice. The negative normal technique does not alter the digital rendering, but only the 3-D printed object. This is because the digital rendering is a hollow object, whereas the 3-D printed object is solid. Hence, stating that the negative normal "removes" material from the positive object is a misnomer, strictly speaking, though it may be a convenient way of thinking of the technique. More precisely, the material is never applied to the 3D printed object in the first place. The bottom-most object 74 in FIG. 8 illustrates the results of the negative normal technique used a number of times.

If the negative normal technique were not used in the example of FIG. 7, the many bumps 72 of final shoe insole would have to be generated individually. The amount of processing resources used to calculate a bump which is constructed of many of positive polygonal planes of varying size is substantially more than the processing power to create a simple negative shape which has comparatively fewer polygonal planes.

Figure 9:
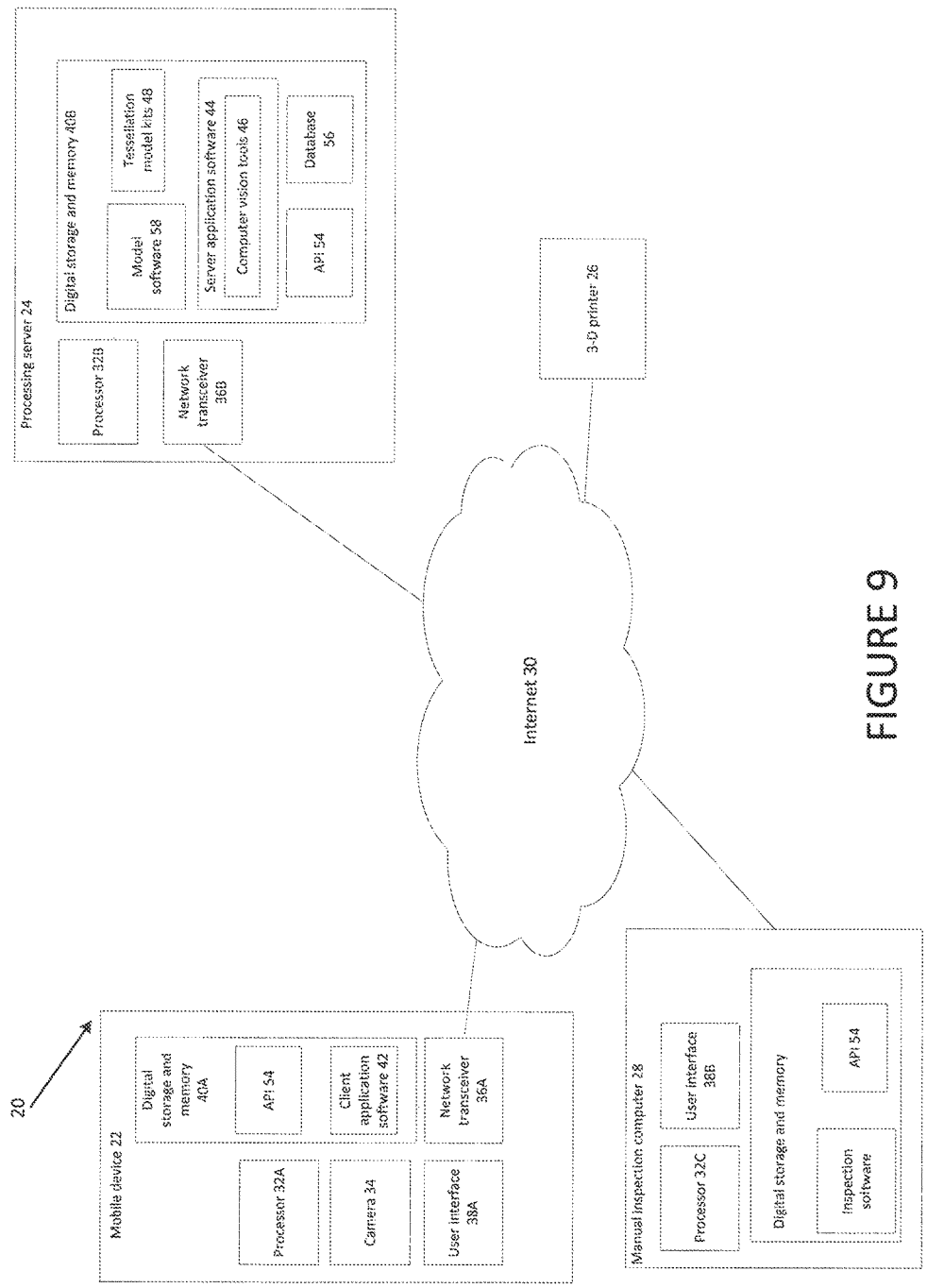
FIG. 9 is a block diagram illustrating a distributed system for the generation of customized 3D printed wearables.

FIG. 9 is a block diagram illustrating a distributed system for the generation of customized 3D printed wearables according to the technique introduced here. Embodiments of the system and method herein may be distributed. The hardware involved may communicate over a network operated by different parties, be directly connected operating by the same party, or any combination thereof.

For example, in some embodiments, the 3D printer 26 is a network location and outsourced to a contractor for 3D printing. This contrasts with FIG. 1 in which the 3D printer 26 is directly connected with the backend processing server 24. Accordingly, instructions are sent to the 3D printer 26 over a network. Additionally, in the manual inspection computer 28 may be separate from the backend processing server 24, in both a physical sense and as an acting entity. For example, the manual inspection computer 28 may be operated by a doctor of a patient who owns the mobile device 22. In another configuration, the manual inspection computer 28 may be operated by the same corporate entity that operates the processing server 24. In yet another configuration, both the mobile device 22 and the manual inspection computer 28 are operated by a doctor of a patient for whom body images/videos are taken.

The above are merely examples—there are multiple combinations or distributions of actors and hardware. In order to achieve this distribution, embodiments of the system introduced here include a software interface, such as application program interface ("API") 54, which is used across the distributed hardware to coordinate inputs and outputs in order to reach a 3D-printed and delivered wearable. The API 54 is instantiated on a number of the hardware objects of the system, and ultimately references databases 56 on the processing server 24.

The database 56 stores body images/videos, associated 3D models of body parts, and 3D models of wearable which match the 3D models of the body parts. Each of these images/models are indexed by a user or order number. Devices which instantiate the API 54 may call up images/videos/materials at various points in the wearable generation process, provide input, and observe status of said materials. The API 54 is able to provide query-able status updates for a given wearable order. In this way, the wearable generation has a great degree of transparency and modularity.

Figure 10:
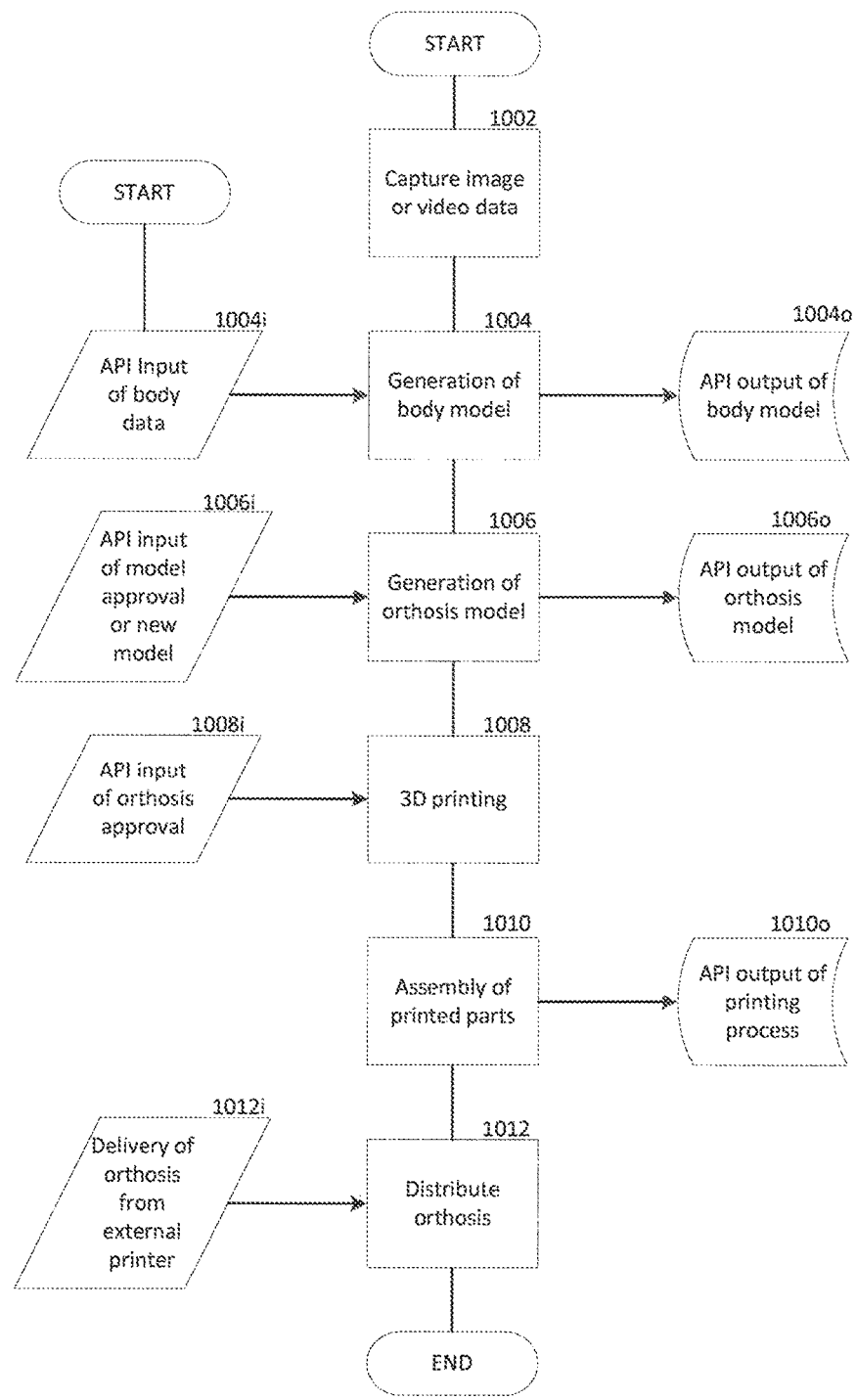
FIG. 10 is a flowchart illustrating API access at a number of steps in wearable generation.

FIG. 10 is a flowchart illustrating a process for API access at a number of steps in wearable generation. The process does not necessarily have to be performed by a single entity. Rather, there are a number of starting points and ending points where different entities may participate in the process. The flow chart of FIG. 10 shows inputs on the left, outputs on the right, and processes down the middle.

Each input ("i" steps) may be performed by one of a number of relevant actors. Alternatively, each process step has a result which is passed to the next step. Depending on the steps, process steps may include external input, as previous process result as input, or both. Outputs ("o" steps) provide visibility into the process and help provide human actors information to make decisions in future steps, or to provide entertainment value.

In step 1002, the system obtains image or video data of a part of a living body. Step 1002 is technically an input as well. For the purposes of FIG. 10, step 1002 refers to obtaining the video or images through mobile application software 42, making use of a device camera. The mobile application software 42 has an internal (non-API based) connection to the processing server 24.

Alternatively, or in conjunction, the process begins at step 1004i. In step 1004i, the API 54 receives body data, which is subsequently provided to the processing server 24. In this case, the API 54 is installed as an extension within other non-operating system software. The API 54 is installed on an imaging device or on a computer which contains data collected from an imaging device. This data may vary in format, number of dimensions, and content.

In step 1004, the processing server 24 uses the input (for 1002, 1004i, or both) to generate a digital body model. The digital body part model may come in a number of formats. In some embodiments, the digital body model is a 3D model; in others the digital model is a series of figures which model size, shape, and character; in still others the digital model is a number of 2D images including properties and metadata.

The creation of the digital body model occurs first through format recognition and then computer vision. The processing server 24 first identifies the format of the input received in order to determine how said input is processed. Once the format is determined, the method of computer vision is determined. The result of the computer vision process is the digital body model. In some embodiments, such as those already including a 3D body model, the computer vision process is skipped.

In step 1004o, the API 54 exposes the digital body model. Accordingly, users, doctors of users, or other suitable persons relevant to the creation of an wearable are able to view the data on a number of hardware platforms. The digital body model is indexed by the user or order number, and thus searching the database 56 via the API 54 may return the digital body model output.

In step 1006i, relevant persons are enabled to either provide their own body models from 3D imaging devices, and or previously measured figures through the API 54, or cause the API 54 to provide messaging to the processing server 24 accepting the body model input of step 1004. The body models would come from other existing scanners, or models that were generated by the user. The API 54 accepts the pre-generated models as input and move that input forward in the process as if the user submitted body model was the result of step 1004.

In step 1006, the processing server 24 generates a digital wearable 3D model based on the digital body model. The generation of the 3D model of the wearable proceeds as methods taught herein have disclosed, or by another suitable method known in the art. In step 1006o, the API 54 exposes the 3D wearable model. Accordingly, users, doctors of users, or other suitable persons relevant to the creation of a wearable are able to view the 3D wearable model on a number of hardware platforms. The 3D wearable model is indexed by the user or order number, and thus searching the database 56 via the API 54 may return the 3D wearable model output.

In step 1008i, relevant persons are enabled through a user interface to cause the API 54 to provide messaging to the processing server 24 accepting the 3D wearable model input of step 1006. The output of step 1006o provides the basis for the user's decision. In step 1008, the 3D wearable model is transmitted to a 3D printer 26 for printing. In some embodiments 3D printing occurs through an additive process, though one skillful in the art would appreciate 3D printing through reduction.

In step 1010, where there are a number of separately printed components of the wearable, these components are assembled. In some embodiments, where the 3D printer 26 is operated by an external printing entity, multiple components are sent to a central location/entity for assembly. In some embodiments the system routes printing and/or assembly to remote locations based upon delivery address. These steps may be performed close to the delivery location where assets are available to provide the service.

At step 1010o, the processing server 24 uploads an assembly process video or time lapse to a host location. Where cameras are available at the 3D printer 26, or the assembly process, regular image captures or videos are taken and indexed by user or order number. These image captures or videos may be assembled into a wearable generation video and posted on a web site hosted by the processing server 24, or into an external video hosting service (such as YouTube).

In step 1012i, if an external printer still holds the printed wearable, the wearable is shipped to the central customer management location. In step 1012, the central customer management ships printed wearable to a user and/or doctor. In some embodiments, elements of the order are provided to a local asset for delivery to the user.

Figure 11:
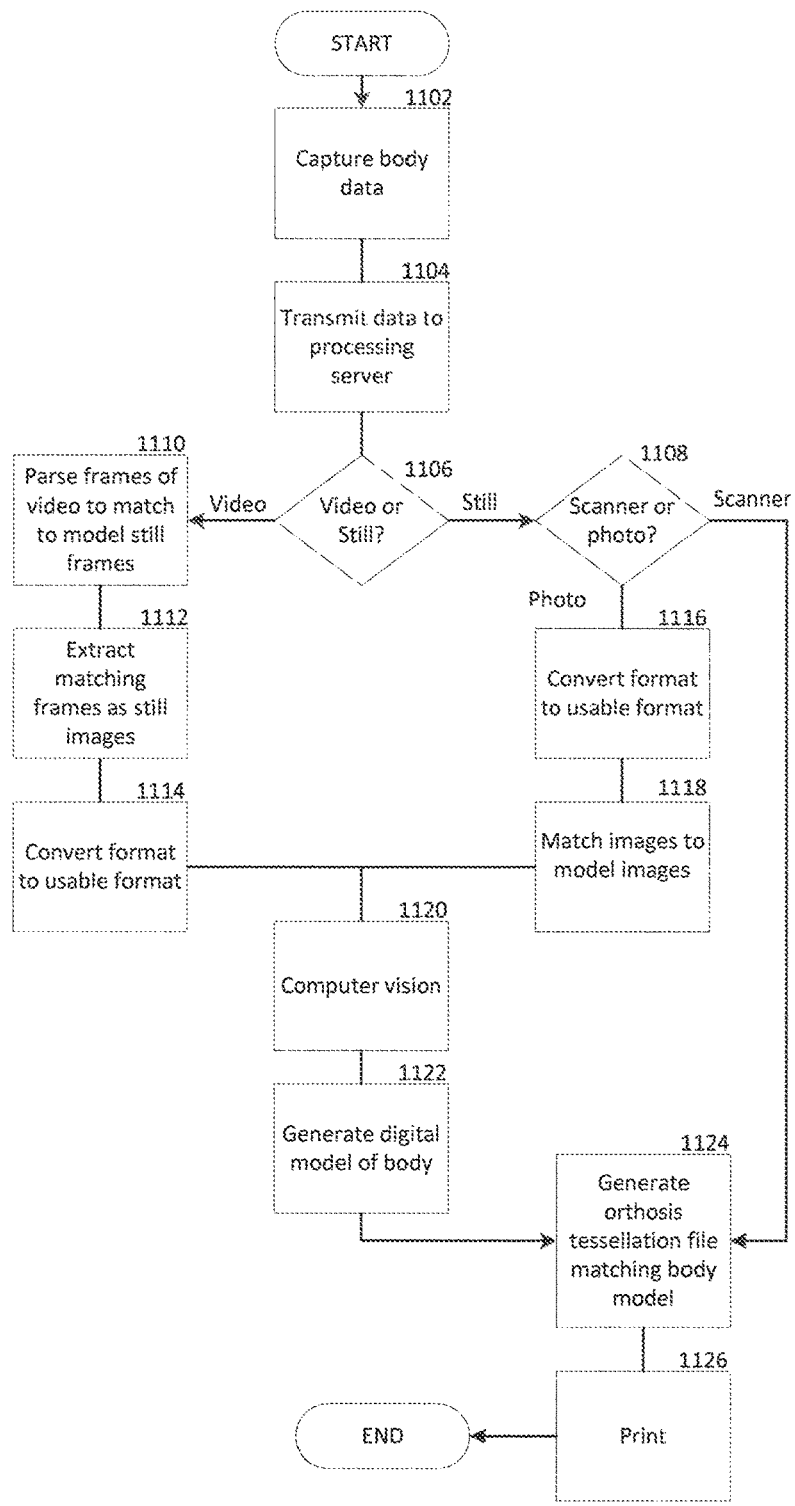
FIG. 11 is a flowchart illustrating an embodiment for handling a number of input body data types.

FIG. 11 is a flowchart illustrating an embodiment for handling a number of input body data types. While many of these steps refer to the processing server 24 as the actor, multiple sources may actually perform these steps as illustrated by FIG. 10. In step 1102, body data is obtained. As described above, the character of the body data may vary. Examples include: 2D/3D images/video with various levels of penetration and light exposure/usage (e.g. conventional photography/video; infrared imaging/video data; confocal microscopy data; lightfield imaging data; or ultrasound imaging data). This data may come from a number of sources. In step 1104 the body data is transmitted to the processing server 24.

Once transmitted, the format of the data is determined. In step 1106, the processing server 24 categorizes the data as video or still. Where the data is a still, in step 1108 the data is categorized as photograph(s) or scanner models. A scanner model refers to a 3D model generated by a body scanner.

In step 1110, where the body data is a video, the processing server 24 parses frames (stills) of the video and matches to model still images. The matching is performed with pixel and object comparisons. Objects are identified in the frames based on pixels. Pixels or objects are matched to pixels or objects in the model images. In step 1112, the processing server 24 extracts the frames that best match the model images from the video as stills. In step 1114 the processing server 24 converts the frames into image files.

In step 1116, where a still photograph is detected, the photograph is converted into an image format that computer vision may be performed on. This is relevant in the case of, for example, images that are not taken in the visible spectrum (such as infrared or ultrasound images). In this step objects are identified from the pixels in the image file. In step 1118, images are matched to model images similarly to in step 1110. However, depending on where the body data photographs originated from, the photographs may already match model images (e.g., where photo capture instructions are followed prior to transmitting the body data).

In step 1120, regardless of the original body data input, the current product of the process with be in the same image data format after the conversions in steps 1114 and 1118. Accordingly, the processing server 24 runs the computer vision process on the images. The computer vision process identifies characteristics of the photographed/recorded body part. In step 1122, the processing server 24 generates a digital body model. A digital model may take a number of forms, one of which originates from a body scanner in step 1108 without additional modification. Other digital body models are descriptive numbers in particular parameter fields. Regardless of the type of digital body model, in step 1124, the processing server 24 generates a wearable tessellation file that corresponds to the digital body model. In step 1126, a 3D printer prints that tessellation file.

Figure 12:
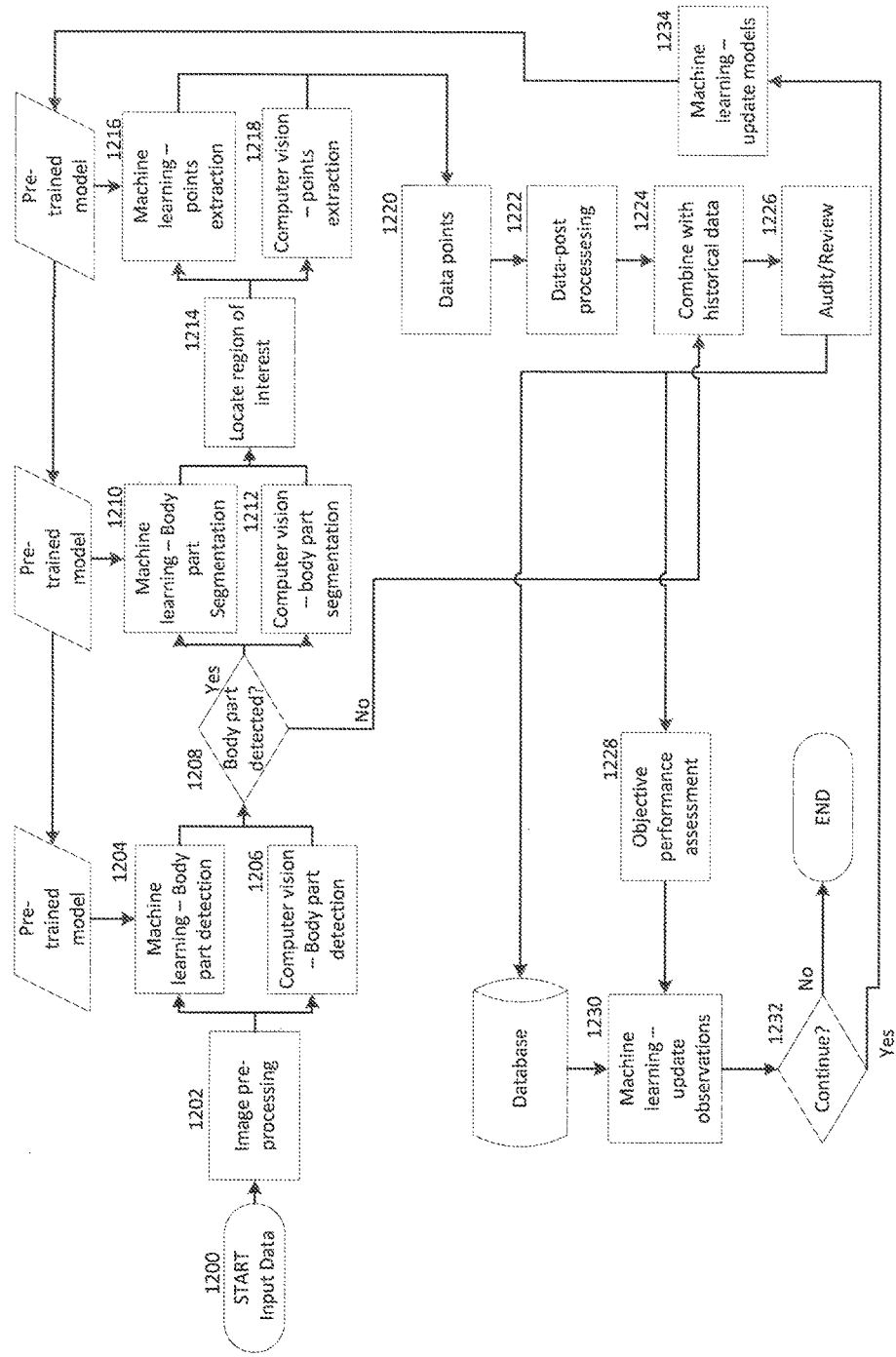
FIG. 12 is a flowchart illustrating wearable generation including simultaneous computer vision and machine learning processes.

FIG. 12 is a flowchart illustrating wearable generation including concurrent computer vision and machine learning processes. FIG. 12 is a detailed look at step 1004 of FIG. 10 and some surrounding steps. The steps of FIG. 12 are generally performed by the processing power available within the entire system. However, the processing power may be distributed across a number of devices and servers. For example, some steps may be performed by a mobile device such as a smart phone while others are performed by a cloud server.

In step 1200, input body part image data is provided to the system. The input data may be provided in any of various ways (e.g. through direct upload from smartphone applications, web uploads, API uploads, partner application uploads, etc.). In step 1202, the uploaded body part image data is processed to obtain a uniform image format for further processing. FIG. 11 details portions of the image pre-processing.

Once the body image input data is in a uniform data format, the method proceeds to steps 1204 and 1206. In steps 1204 and 1206, the system attempts to detect a body part in the subject images. This is performed both through computer vision and machine learning. Prior observations and models (e.g. hidden Markov model) influence the machine learning operation. The detection of a particular body part enables the system to determine the type of product that is most relevant. In some embodiments, the system performs the body part identification initially to enable the user to select a product type choice (e.g. footwear insole, bra, earphones, gloves, etc.).

In step 1208, the system checks whether a body part was, in fact, detected. Where a body part was detected, the method proceeds, whereas where a body part was not detected, the method skips to observational steps to update the machine learning models. The user interface will additionally signal the user and the user may initiate the method again form the beginning.

In some embodiments, steps 1204-1208 are processed by local mobile devices owned by a user. Because these steps are often performed before the user selects a product type (steps identify body part and product chosen after body part identification), some efficiency may be gained by using local processing power as opposed to transmitting the data prior to making the body part identification.

Further, the product type selection user experience enables the system to "hide" the data transmission from the mobile device to the cloud server. Once a body part is identified, the user begins selecting a product style, types and sub-types. While the user is engaged in these operations, the body part image data is uploaded from the mobile device to the cloud server, and the user experience is not stalled.

In steps 1210 and 1212, the system performs image segmentation using computer vision and machine learning. Prior observations and models (e.g. hidden Markov model) influence the machine learning operation. Image segmentation is used to identify particular elements in an image such as differentiating the body part from the background, as well as differentiating different curves and surfaces of the body part.

In step 1214, the system identifies regions of the body part which are relevant for curvature of 3-D models (such as tessellation files). In steps 1216 and 1218, the system performs point extraction using computer vision and machine learning. Prior observations and models (e.g. hidden Markov model) influence the machine learning operation. The points extraction process generates a number of points along curves identified through segmentation. Each of these points is assigned a point in either 2-D or 3-D space. Measurements for point coordinates are provided based on solved distances using reference objects, or solving through image analysis.

In step 1220, the extracted data points are assembled into usable data for 3-D model generation or tessellation file generation. In step 1222, the data points and body part images undergo post-processing. In step 1224, The system adds the data points and body part image data to the total observations. In step 1226, the system enables users, or administrators to do an audit review. This step is detailed in above paragraphs. At this point the data points are delivered to model generation and the rest of the 3-D printing process continues separately.

After steps 1220-1226, the data is added to a database. The process of FIG. 12 continues with an assessment and learning phase. In step 1228, the system reviews and performs a performance assessment of the process. In step 1230, the machine learning engine of the system updates the observations from the database and the performance assessment. If the process continues, in step 1234, the machine leaning models are updated. The updated machine learning models are recycled into use into steps 1204, 1210, and 1216 for subsequent users.

Figure 13:
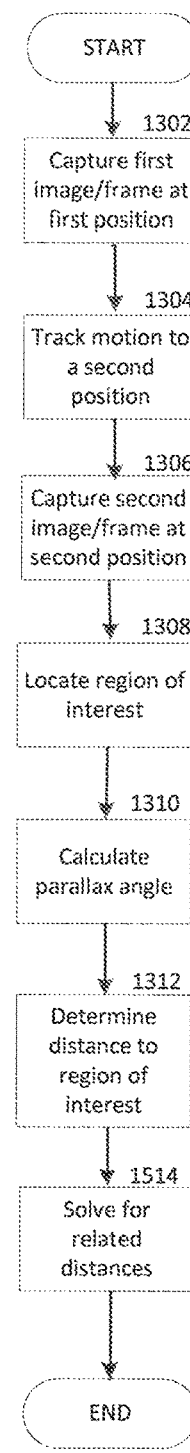
FIG. 13 is a flowchart illustrating distance measurement in images taken from single lens 2-D cameras.

FIG. 13 is a flowchart illustrating distance measurement in images taken from single lens 2-D cameras. Where the mobile device includes a single camera and an inertial measurement unit (IMU) parallax distance measurement between two photographs may be used to determine a known distance and therefore calculate sizes of the body part. Similarly with the reference object, once the image has a first known distance, other sizes within the image (such as the shape of body parts) may be calculated with mathematical techniques known in the art.

In step 1302, a first image is taken in a first position. In step 1304 the camera is moved, and the IMU tracks the relative movement from the first position to a second position. In step 1306, The camera then takes a second image.

The method may be performed with a video clip as well. While the video clip is captured, the IMU tracks the movement of the mobile device relative to a first location. Time stamps between the video clip and the IMU tracking are matched up to identify single frames as static images. In step 1308, the system identifies regions of interest in the images. This is explained in FIG. 12 at step 1214.

In step 1310, given information from the IMU the system calculates the parallax angle between where the first image was captured and the second image. In step 1312, the system calculates distance to the region or point of interest based on the parallax angles and distances between the first and second position. In step 1514, the system is able to use geometric math to solve for the distance between a number of distances within each image. These distances are used to provide coordinates to a number of points in images, and then later used to develop 3-D models of objects within the images.

Figure 14:
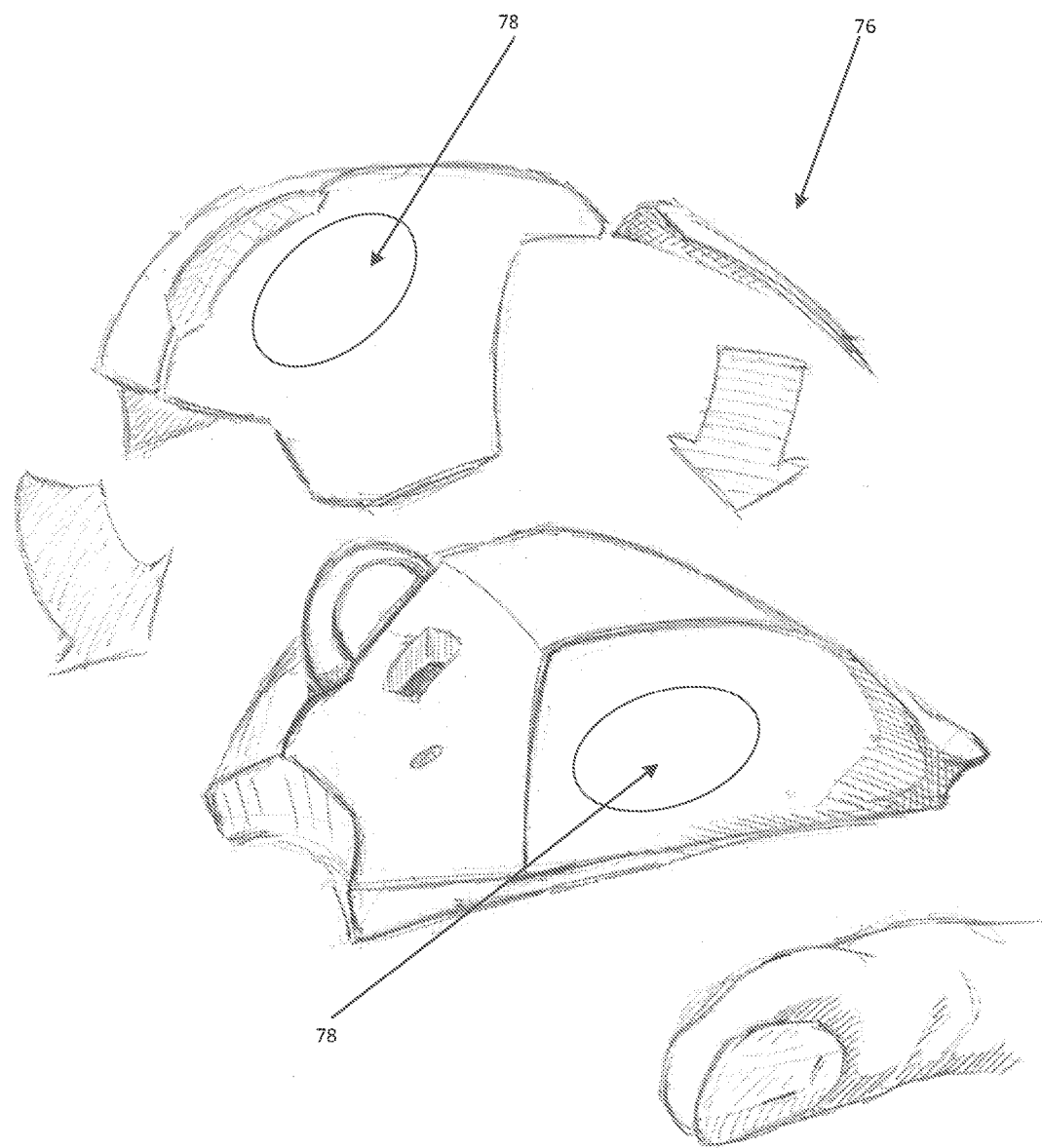
FIG. 14 is a graphic illustration of a customized computer mouse generated through body scanning.

FIG. 14 is a graphic illustration of a customized computer mouse generated through body scanning. In addition to wearables, the processes taught in this disclosure may be used to generate items interfacing with the contours of a user's body as well. One example of such an item is a computer mouse 76. Mouse peripherals are designed to have a significant interface with the human body, specifically, a human hand and fingertips. Where body image data is collected on a user's fingers, the system may generate a computer mouse 76 with matching finger indentations 78 custom printed for a particular user.

Figure 15:
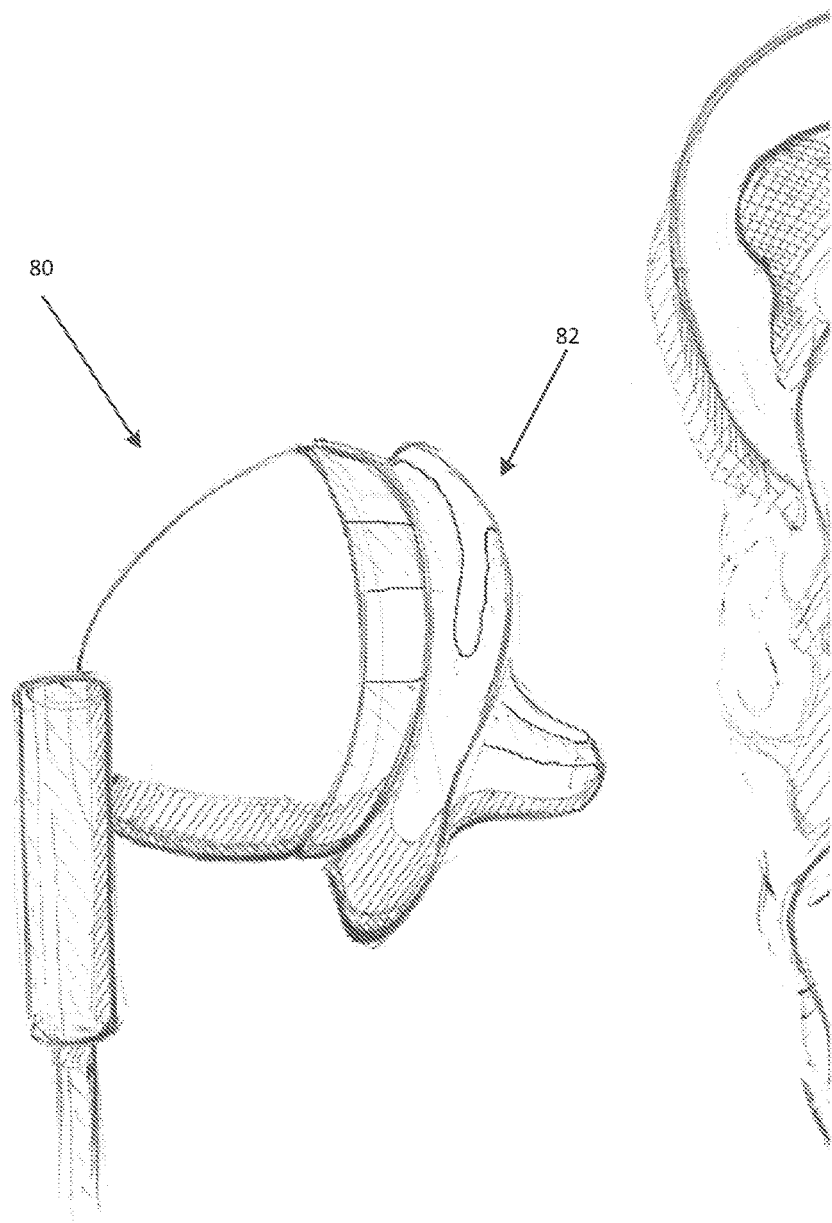
FIG. 15 is a graphic illustration of a customized ear headphone generated through body scanning.

FIG. 15 is a graphic illustration of a customized ear headphone generated through body scanning. Another example of a wearable that can be custom designed in the disclosed system is a headphone 80, the headphone has a speaker enclosure 82 which is custom formed to an ear cavity. Using body image data of a person's ear enables custom generation of fitted ear cavity speakers 82.

Figure 16:
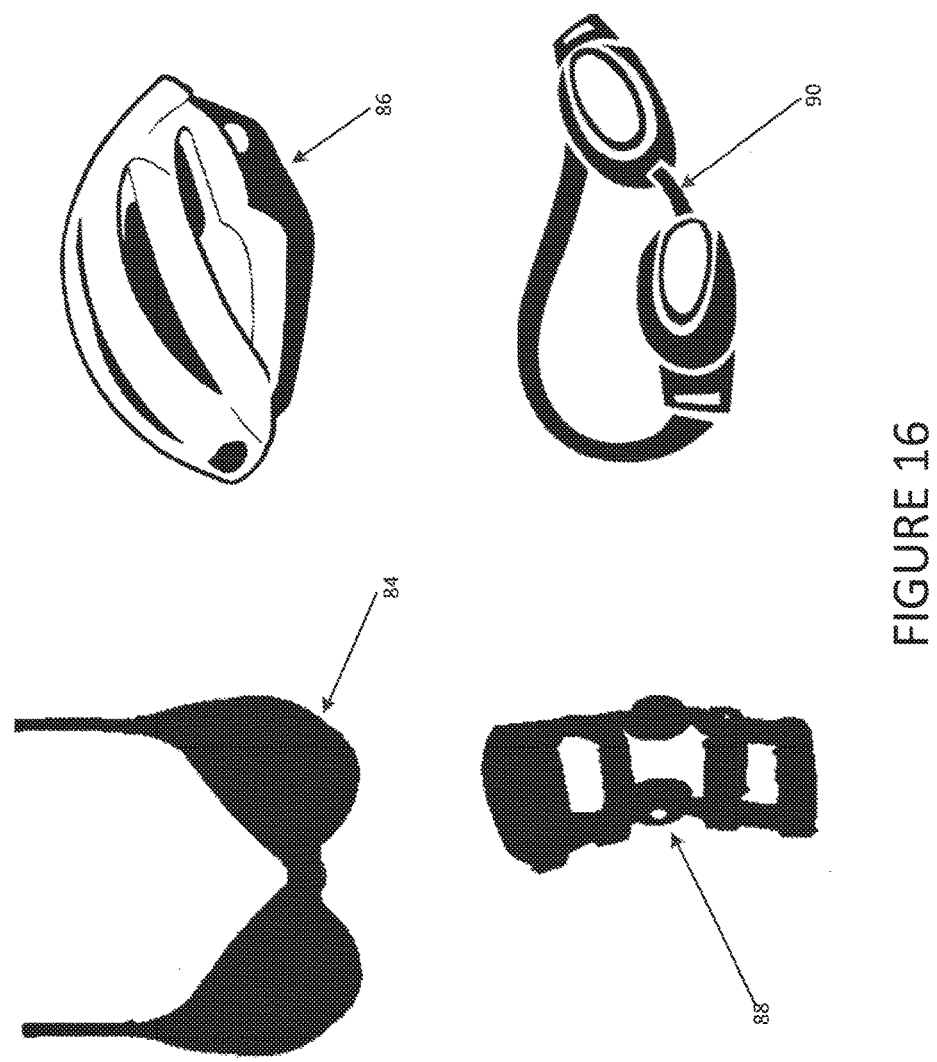
FIG. 16 is a graphic illustration of an assortment of wearables that are generated via body imaging followed by 3-D printing.

FIG. 16 is a graphic illustration of an assortment of wearables that are generated via body imaging followed by 3-D printing. The illustrations in FIG. 16 are intended to be illustrative of 3D-printable wearables that conform to a body part of the wearer. Examples include a bra 84, a helmet 86, a brace 88, or goggles 90. There are many possible wearables suited for many purposes.

Figure 17:
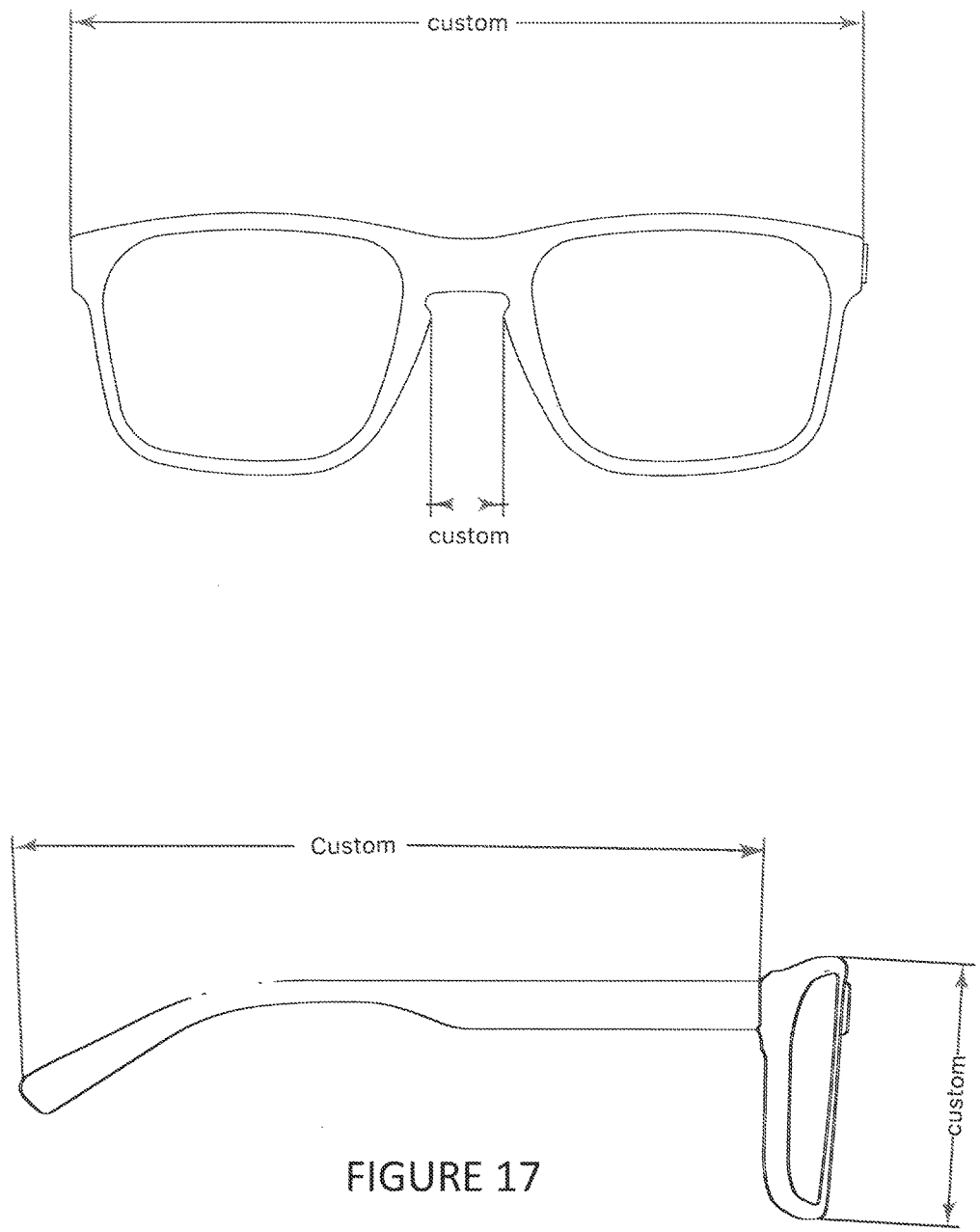
FIG. 17 is a graphic illustration of customized eye glasses generated through body scanning.

FIG. 17 is a graphic illustration of customized eye glasses generated through body scanning. Another example of a wearable that can be custom designed in the disclosed system are eye glasses. A number of segments may be customized to a user's body.

Figure 18:
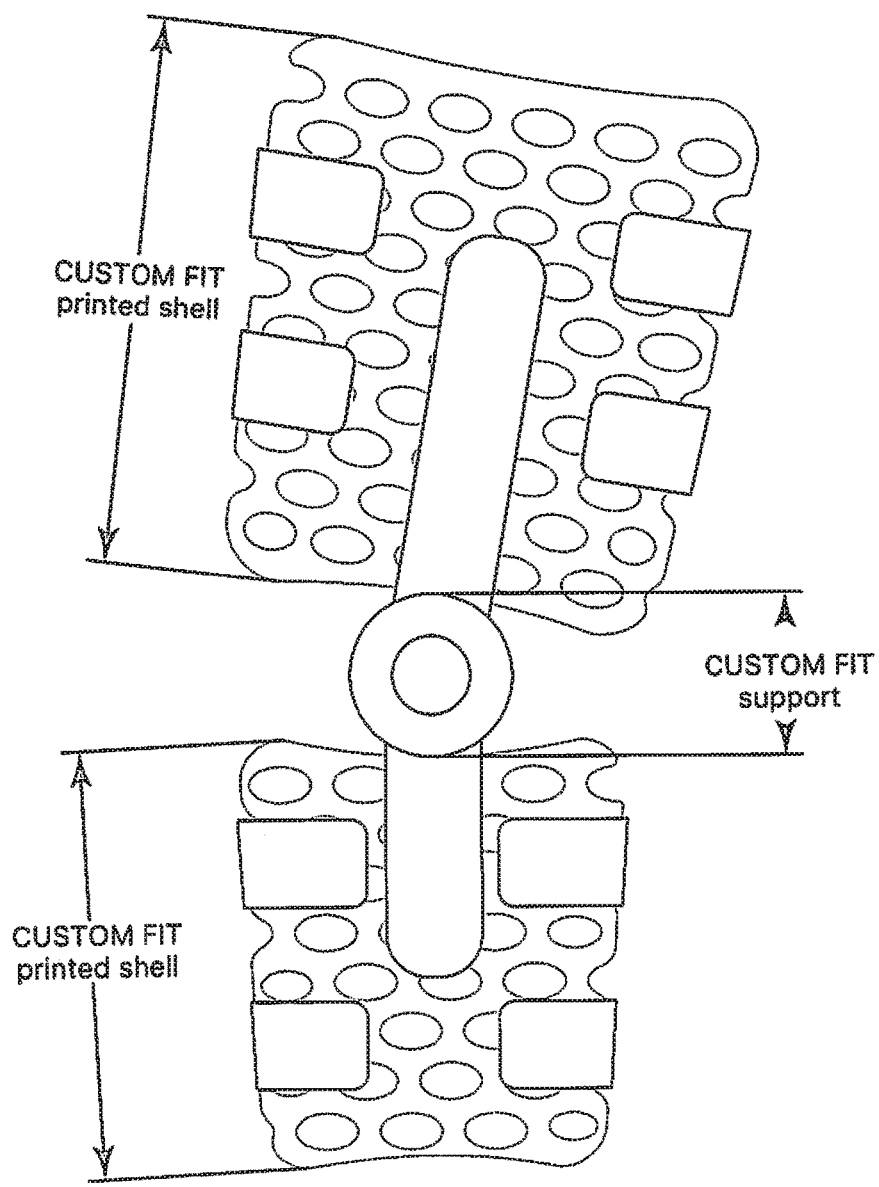
FIG. 18 is a graphic illustration of a customized brace generated through body scanning.

FIG. 18 is a graphic illustration of a customized brace generated through body scanning. Another example of a wearable that can be custom designed in the disclosed system is a brace type orthotic. A number of segments may be customized to a user's body.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

The invention claimed is:

1. A method comprising:
   receiving, through a program interface, a top view image and a side view image of a bare foot, at least one of the top view image or the side view image of the bare foot including a reference object;
   generating one or more two-dimensional (2D) coordinate graphs of the bare foot based on the top view image and the side view image of the bare foot, the one or more 2D coordinate graphs each including coordinates in only two dimensions;
   deriving a size of the bare foot and a shape of an arch of the bare foot from the one or more 2D coordinate graphs and a known size of the reference object;
   generating a 3D model of a wearable object corresponding to the bare foot based on the size of the bare foot and the shape of the arch of the bare foot derived from the one or more 2D coordinate graphs of the bare foot; and
   sending, to a 3D printer, information for use in printing a physical wearable object based on the 3D model.

2. The method of claim 1, further comprising:
   receiving a message, by the program interface, from a user, the message accepting the 3D model of the wearable object; and
   printing, by a 3D printer, a wearable object corresponding to the 3D model of the wearable object.

3. The method of claim 1, further comprising:
   receiving, by a mobile device application, a set of images of the bare foot from a mobile device camera;
   filtering, by the mobile device application, the set of images of the bare foot into accepted images and rejected images based upon a computer vision comparison to reference images, wherein the reference images preexist the set of images of the bare foot; and
   communicating, by the mobile device application, accepted images to the program interface as the image of the bare foot from the side view and the image of the bare foot from the top view.

4. The method of claim 1, wherein the reference object is a sheet of standardized-size paper.

5. The method of claim 3, further comprising:
   issuing instructions, by the mobile device application, to a user of an associated mobile device depicting expected positioning of the bare foot.

6. The method of claim 1, wherein the top view image and side view image comprises at least one of:
   infrared imaging data;
   confocal microscopy data;
   lightfield imaging data; or
   ultrasound imaging data.

7. The method of claim 1, further comprising:
   collecting, by a mobile application of a mobile device, video data of a bare foot, the video data including a video clip wherein a film perspective rotates about the part of the living body; and
   extracting image frames from the video data, the image frames including the top view and the side view images of the bare foot, wherein the image frames are determined by comparing and matching each frame of the video data to reference frames, wherein the reference frames preexist the video data.

8. The method of claim 1, wherein the program interface is an application program interface (API), and wherein said exposing step further comprises:
   exposing for download or temporary access, through the API, the 3D model of the wearable object;
   requiring a password to access the 3D model of the wearable object, the password associated with the view and side view images of the bare foot.

9. The method of claim 1, further comprising:
   printing, by a 3D printer, a wearable object corresponding to the 3D model of the wearable object;
   generating a time-lapse video depicting said printing step; and
   transmitting the time-lapse video to a web host for hosting.

10. The method of claim 1, wherein said generating the 3D model of the wearable object further comprises:
    identifying a tessellation kit that matches a predetermined wearable object class; and
    modifying the identified tessellation kit based on the size of the bare foot and the shape of the arch.

11. The method of claim 10, wherein said generating the 3D model of the wearable object further comprises:

determining the predetermined wearable object class based on categorization of the size of the bare foot and the shape of the arch.

12. A method comprising:
receiving, by a processor, video data of a part of a living body, the video data including a video clip wherein a camera perspective rotates about the part of the living body;
extracting image frames from the video data, the image frames including the part of the living body captured at a number of perspectives, wherein the extracted image frames are based on a matching comparison between each frame of the video data to one or more reference frames, wherein the reference frames preexist the video data;
generating, a digital model of the body part based on the extracted imaged frames; and
generating, a 3D model of a wearable corresponding to the part of the living body based on the digital model.

13. The method of claim 12, further comprising:
exposing, through an API, the 3D model of the wearable.

14. The method of claim 13, wherein said exposing step further comprises:
requiring a password to access the 3D model of the wearable, the password associated with the body part image data.

15. The method of claim 12, wherein the body part of the living body is a foot, and the 3D model of a wearable is a footwear insert.

16. The method of claim 12, further comprising:
printing, by a 3D printer, a wearable corresponding to the 3D model of the wearable;
generating a time-lapse video depicting said printing step; and
transmitting the time-lapse video to a web host for hosting.

17. The method of claim 12, further comprising:
determining physical dimensions of the part of the living body using two or more frames of the video data as parallax viewpoints.

18. A system comprising:
a network-connected server configured to process a top view image and a side view image of a bare foot, wherein at least one of the top view image or side view image of the bare foot includes a reference object, the network-connected server further configured to generate one or more two-dimensional (2D) coordinate graphs of the bare foot based on the top view image and the side view image of the bare foot, the one or more 2D coordinate graphs each including coordinates in only two dimensions, and wherein the network-connected server is configured to derive a size of the bare foot and a shape of an arch of the bare foot from the one or more 2D coordinate graphs and a known size of the reference object, the network-connected server configured to generate a 3D model of a wearable object corresponding to the bare foot based on the size of the bare foot and the shape of the arch of the bare foot derived from the one or more 2D coordinate graphs of the bare foot; and
a program interface instantiated on a number of devices external to the network-connected server and configured to communicate with the network-connected server, the program interface configured to receive top and side view images on a first device of the external devices.

19. The system of claim 18, further comprising:
a communication interface configured to output the 3D model of the wearable object to a 3D printer configured to print the wearable object from the 3D model of the wearable object.

20. The system of claim 18, further comprising:
a mobile device application instanced on a mobile device, the mobile device application in communication with the web server via a mobile device network communicator and is integrated with the program interface, the mobile device application configured to interface with a mobile device camera and capture top and side view images of the bare foot.

21. The system of claim 19, further comprising:
a video server that hosts time-lapse videos that are accessible from the Internet.

22. The system of claim 19, wherein the network-connected server is, while generating the 3D model of the wearable object, further configured to:
identify a tessellation kit that matches a predetermined wearable object class;
modify the identified tessellation kit based on the size of the bare foot and the shape of the arch.

23. The system of claim 18, wherein the network-connected server is, while generating the 3D model of the wearable object, further configured to:
determine the predetermined wearable object class based on categorization of the size of the bare foot and the shape of the arch.

24. A method comprising:
collecting, by a mobile device application of a mobile device, video data of a part of a living body, the video data including a video clip wherein a camera perspective rotates about the part of the living body;
determining, by the mobile device application of the mobile device, whether frames from the video data match stored reference frames within a predetermined margin of error, wherein the reference frames preexist the video data; and
transmitting, by the mobile device application of the mobile device, the frames of the video data that are determined within the predetermined margin of error to a network-connected server for further processing.

25. The method of claim 24, further comprising:
receiving, by the mobile device application of the mobile device, a 3D model of a wearable corresponding to the body part specifically included in the video data.

26. The method of claim 25, further comprising:
transmitting, by the mobile device application of the mobile device, a quality control message to the network-connected server indicating either approval or rejection of the 3D model of the wearable.

* * * * *